(12) United States Patent
Ashikaga et al.

(10) Patent No.: US 10,593,617 B2
(45) Date of Patent: Mar. 17, 2020

(54) SEMICONDUCTOR DEVICE

(71) Applicant: TOSHIBA MEMORY CORPORATION, Tokyo (JP)

(72) Inventors: Hiroshi Ashikaga, Kawasaki Kanagawa (JP); Naoki Kimura, Ebina Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/910,425

(22) Filed: Mar. 2, 2018

(65) Prior Publication Data

US 2019/0088583 A1 Mar. 21, 2019

(30) Foreign Application Priority Data

Sep. 19, 2017 (JP) ................. 2017-179056

(51) Int. Cl.
*H01L 23/495* (2006.01)
*H01L 23/498* (2006.01)
*H01L 25/065* (2006.01)
*H01L 23/544* (2006.01)
*H01L 23/31* (2006.01)
*H01L 23/00* (2006.01)

(52) U.S. Cl.
CPC .. *H01L 23/49838* (2013.01); *H01L 23/49816* (2013.01); *H01L 23/49827* (2013.01); *H01L 23/544* (2013.01); *H01L 25/0655* (2013.01); *H01L 23/3128* (2013.01); *H01L 24/16* (2013.01); *H01L 2223/54433* (2013.01); *H01L 2223/54486* (2013.01); *H01L 2224/131* (2013.01); *H01L 2224/16225* (2013.01); *H01L 2224/16235* (2013.01); *H01L 2224/32225* (2013.01); *H01L 2224/73204* (2013.01); *H01L 2224/92125* (2013.01); *H01L 2924/15311* (2013.01); *H01L 2924/3511* (2013.01)

(58) Field of Classification Search
CPC ......... H01L 23/49827; H01L 23/49838; H01L 23/544; H01L 23/552; H01L 23/556; H01L 23/60; H01L 2223/54433
USPC ....................................................... 257/660
See application file for complete search history.

(56) References Cited

U.S. PATENT DOCUMENTS 5,640,048 A * 6/1997 Selna ................... H01L 23/3128
257/659
5,717,245 A * 2/1998 Pedder .............. H01L 23/49816
257/664
5,808,878 A * 9/1998 Saito ..................... H01L 23/552
361/818

(Continued)

FOREIGN PATENT DOCUMENTS

JP 2014-22738 A 2/2014

*Primary Examiner* — Nitin Parekh
(74) *Attorney, Agent, or Firm* — Kim & Stewart LLP

(57) ABSTRACT

According to one embodiment, a semiconductor device includes a first board including a plurality of terminals, a semiconductor chip flip-chip mounted to the first board, and an insulating layer covering the first board and the semiconductor chip. The plurality of terminals include at least one first terminal electrically connected to the semiconductor chip, and at least one second terminal that is not connected to the semiconductor chip, wherein the at least one second terminal is not covered by the insulating layer.

19 Claims, 7 Drawing Sheets

(56) References Cited

U.S. PATENT DOCUMENTS

| | | | | |
|---|---|---|---|---|
| 6,359,341 | B1* | 3/2002 | Huang | H01L 23/13 257/700 |
| 9,565,762 | B1* | 2/2017 | Azeroual | H05K 1/113 |
| 9,972,589 | B1* | 5/2018 | Goh | H01L 23/50 |
| 2003/0001287 | A1* | 1/2003 | Sathe | H01L 23/49811 257/780 |
| 2003/0013969 | A1* | 1/2003 | Erikson | A61B 8/4483 600/459 |
| 2007/0262465 | A1* | 11/2007 | Iwabuchi | H01L 23/62 257/777 |
| 2008/0296697 | A1* | 12/2008 | Hsu | H01L 21/76886 257/379 |
| 2011/0204505 | A1* | 8/2011 | Pagaila | H01L 21/568 257/686 |
| 2011/0298109 | A1* | 12/2011 | Pagaila | H01L 21/56 257/660 |
| 2014/0015148 | A1 | 1/2014 | Lyu | |
| 2014/0070384 | A1* | 3/2014 | Sugimoto | H01L 24/25 257/666 |
| 2014/0306335 | A1 | 10/2014 | Mataya et al. | |
| 2016/0013148 | A1* | 1/2016 | Lin | H01L 23/552 257/773 |
| 2016/0293513 | A1 | 10/2016 | Hiruta | |
| 2017/0179041 | A1* | 6/2017 | Dias | H01L 23/552 |
| 2017/0194299 | A1* | 7/2017 | Kwon | H01L 23/544 |
| 2018/0158752 | A1* | 6/2018 | Choi | H01L 23/3677 |
| 2018/0168029 | A1* | 6/2018 | Kuk | H05K 1/0218 |

* cited by examiner

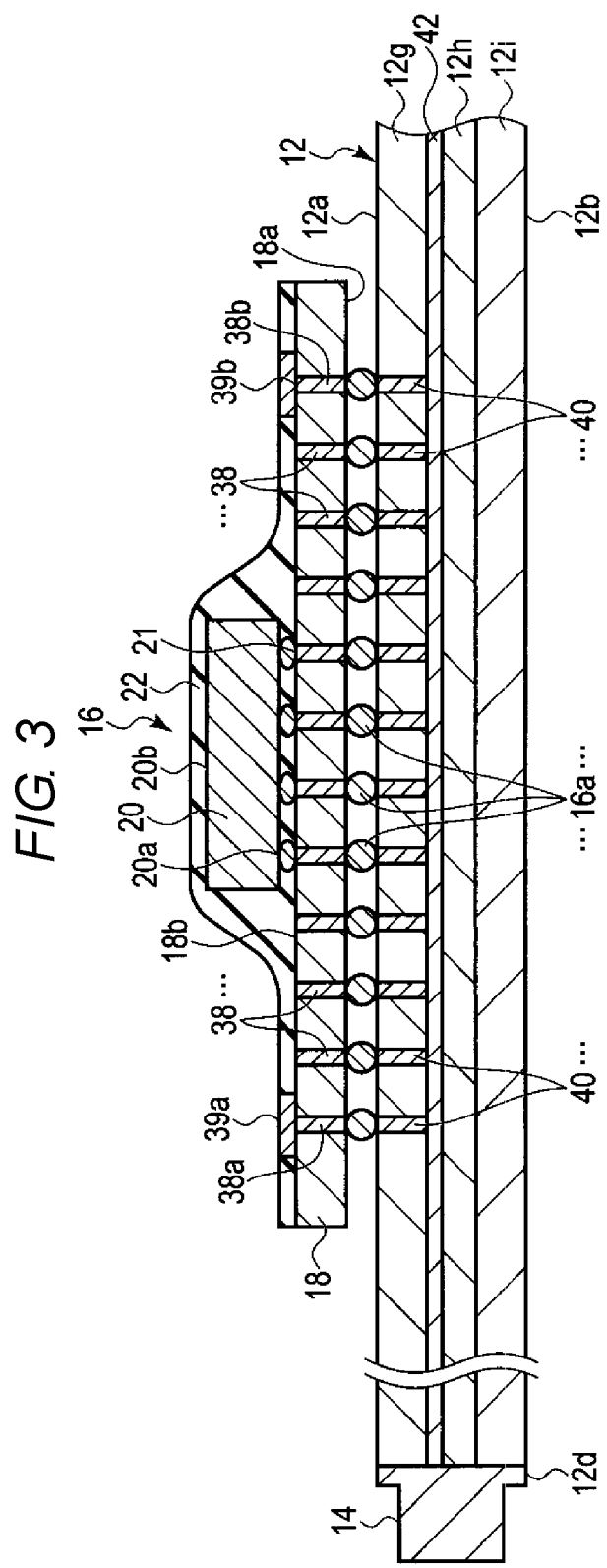

SEMICONDUCTOR DEVICE

CROSS-REFERENCE TO RELATED APPLICATION

This application is based upon and claims the benefit of priority from Japanese Patent Application No. 2017-179056, filed Sep. 19, 2017, the entire contents of which are incorporated herein by reference.

FIELD

Embodiments described herein relate generally to a semiconductor device.

BACKGROUND

Recently, the development of an SSD (Solid State Drive), which is an alternative to an HDD (Hard Disk Drive), has been underway for use as a mass digital storage device. The SSD is configured with a nonvolatile semiconductor memory such as a NAND type flash memory, a controller therefor, and the like. The controller is configured with a semiconductor chip and a chip board, and the semiconductor chip is mounted on the chip board by wire bonding. The chip board as well as the flash memory is mounted on an SSD board.

In recent years, flip-chip mounting technology has been developed as an alternative to wire bonding, so that the semiconductor chip is mounted on the chip board using flip-chip technology. The flip-chip mounting bonds the semiconductor chip to the chip board by arranging very small metal protrusion (solder or the like) terminals called bumps on a front surface of a semiconductor chip, placing the semiconductor chip on the chip board so that the bumps come in contact with the chip board, and temporarily melting the bumps. An encapsulation portion (also referred to as "overmold") formed from a resin material and provided on the wire-bonding mounting is often omitted in the flip-chip mounting. Use of flip-chip mounting is not limited to the semiconductor chip for the controller of the SSD and flip-chip mounting has been in widespread use in a broad range of fields.

A flip-chip mounting semiconductor device of related art is prone to ESD (Electro-Static Discharge) breakdown caused by static electricity. It is noted that the ESD breakdown occurs not only in the controller of the SSD but also in every semiconductor device using the flip-chip mounting.

DESCRIPTION OF THE DRAWINGS

FIG. 3 shows an example of a cross-sectional structure near the controller.

DETAILED DESCRIPTION

Embodiments provide a semiconductor device in which ESD breakdown seldom occurs.

In general, according to one embodiment, a semiconductor device includes a first board including a plurality of terminals, a semiconductor chip flip-chip mounted to the first board, and an insulating layer covering the first board and the semiconductor chip. The plurality of terminals include at least one first terminal electrically connected to the semiconductor chip, and at least one second terminal that is not connected to the semiconductor chip, wherein the at least one second terminal is not covered by the insulating layer.

Example embodiments will be described hereinafter with reference to the drawings. It is noted that this specific embodiments are given as an example only and that the disclosure is not limited by the specific aspects of the examples. While various names or designated characteristics may be given to some elements as described herein, the exemplary designations are example only and other names or specific characteristics may be adopted. Modifications to elements and/or aspects in the present disclosure that a person skilled in the art can easily conceive of are within the intended scope of this disclosure. To make the explanation herein clearer, the sizes, thicknesses, planar dimensions, shapes, and the like of elements are often different from those in actual implementations so that description of particular aspects may be provided. Furthermore, the relationships of dimensions and ratios of components may differ among the various drawings. In general, aspects in the different drawings that are substantially the same as each other are denoted with the same reference symbols and detailed description of repeated aspects may be omitted.

First Embodiment

Figure 1:
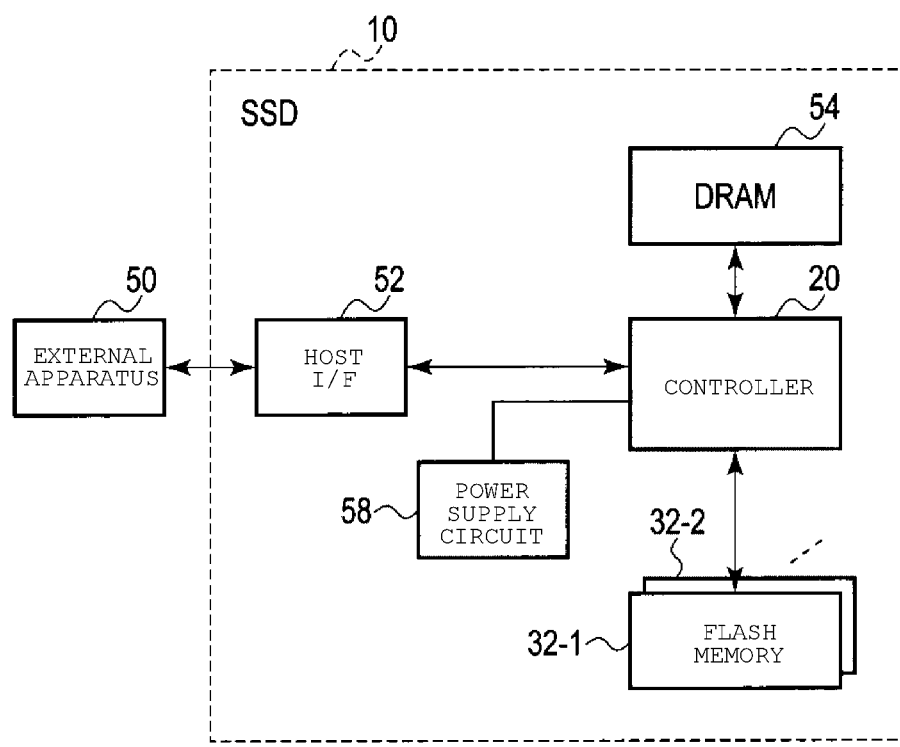
FIG. 1 is a block circuit diagram showing an example of a configuration of an SSD according to a first embodiment.

While various examples of a semiconductor device using flip-chip mounting exist, an SSD will be described as the semiconductor device herein by way of example. FIG. 1 is a block circuit diagram showing an example of a configuration of the SSD according to a first embodiment. As shown in FIG. 1, an SSD 10 includes a controller 20, flash memories (also referred to as "flash memory chips") 32-1 and 32-2 (often collectively denoted by "32") serving as nonvolatile semiconductor memories, a DRAM (also referred to as "DRAM chip") 54, a power supply circuit (also referred to as "power supply circuit module") 58, a host interface (host I/F) 52, and the like.

An external apparatus 50 serving as a host apparatus is connected to the host I/F 52. The external apparatus 50 writes and reads data to and from the flash memories 32. Examples of the external apparatus 50 include a personal computer and a CPU core. As an interface with the external apparatus 50, an interface, for example, PCI Express®, SAS® (Serial Attached SCSI), SATA® (Serial Advanced Technology Attachment), NVMe® (Non Volatile Memory Express), or USB® (Universal Serial Bus) may be used.

The host I/F 52 is connected to the controller 20. The flash memories 32, the DRAM 54, and the power supply circuit 58 are also connected to the controller 20. The number of the flash memories 32 is not limited to two and many flash memories may be provided. The DRAM 54 is an example of a volatile memory and is used for saving of flash memory management information, data caching, and the like. Another volatile memory such as an SRAM may be used as an alternative to the DRAM 54. The power supply circuit 58 is, for example, a DC-DC converter and it generates various voltages necessary for the SSD 10 to operate from power supplied from the external apparatus 50. Although not shown, the controller 20 includes a DRAM I/F and a NAND I/F, and is connected to the DRAM 54 via the DRAM I/F and to the flash memories 32-1 and 32-2 via the NAND I/F.

Figure 2A:
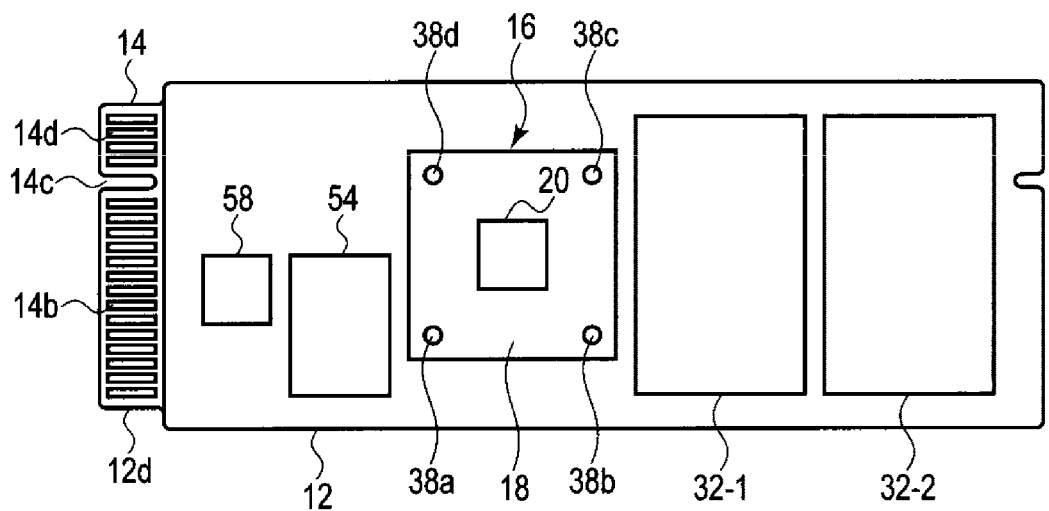
FIGS. 2A and 2B show an example of appearances of the SSD and a controller.
Figure 2B:
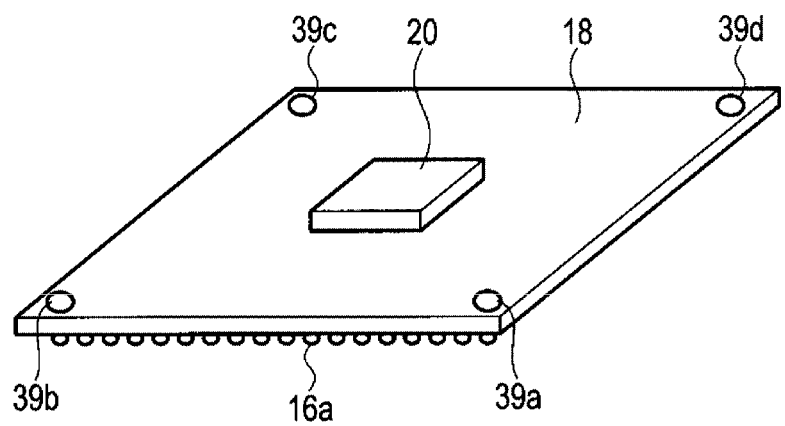
Figure 4A:
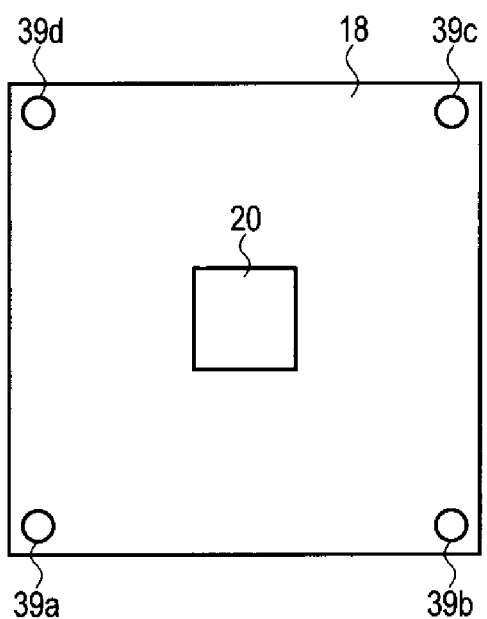
FIGS. 4A, 4B, and 4C show an example of a structure of a controller board.
Figure 4B:
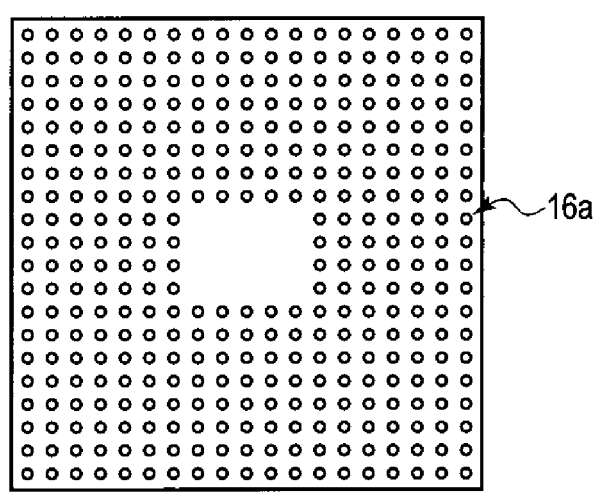
Figure 4C:
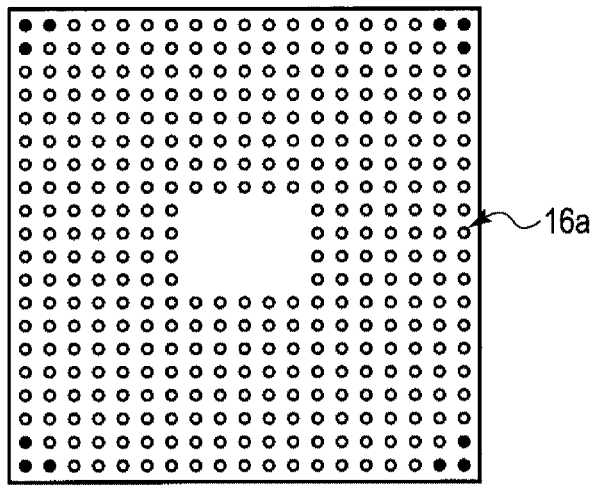

FIG. 2A is a plan view showing an example of an appearance of the SSD, and FIG. 2B is a perspective view showing an example of an appearance of the controller 20. FIG. 3 is a cross-sectional view showing an example of a cross-sectional structure near the controller 20. FIG. 4A is a plan view showing an example of a structure of the controller 20, FIG. 4B is a plan view showing a board of the controller 20 from a board side of the SSD 10, and FIG. 4C is a plan view showing the board of the controller 20 from a controller 20 side.

As shown in FIGS. 2A and 3, a generally rectangular first board (an SSD board, a printed wiring board: PWB, a bare board, a raw board) 12 is a flat plate-like component that has a first surface 12a (a first front surface, a mounting surface, a first board surface, an upper surface), and a rear surface 12b (a lower surface, a bottom surface) on the other side of the first surface 12a.

The first board 12 has a multilayer structure, for example, an eight-layer structure formed by layers of synthetic resins such as epoxy resins. Wiring patterns of various shapes are formed on front surfaces of the layers. For example, a signal layer for transmission and reception of signals, a ground layer, and a power supply layer are formed. In a case of FIG. 3, a three-layer structure (of a first layer 12g, a second layer 12h, and a third layer 12i) is shown for brevity of illustration. A ground layer 42 lies between the first layer 12g and the second layer 12h.

The types of the wiring patterns on the layers can be changed appropriately. For example, different types of wiring patterns may be present on the same layer or some layers having no wiring pattern thereon or therein may be present.

The first board 12 may be a single-sided board (single-layer board) or a double-sided board (two-layer board). If the first board 12 is a single-sided board, a ground pattern, a signal pattern, a power supply pattern, and the like are formed on the first surface 12a. If the first board 12 is a double-sided board, the ground pattern, the signal pattern, the power supply pattern, and the like are formed while being appropriately distributed between the first surface 12a and the rear surface 12b.

A connector 14 for connection to the external apparatus 50, for example, a personal computer or a CPU core is provided on, for example, a side surface 12d of the first board 12.

The ground layer 42 formed on the inner layer of the first board 12, and the signal layer and the power supply layer that are not shown are electrically connected to predetermined terminal pins 14b of the connector 14 and connected to the external apparatus 50. It is noted that a slit 14c is formed at, for example, a position deviated from a central position in the connector 14 and fitted into a protrusion (not shown) provided on the external apparatus 50. It is thereby possible to prevent the SSD 10 from being attached to the external apparatus 50 with the SSD 10 turned upside down.

A ground line (not shown) may be formed on a front surface of the first surface 12a of the first board 12, electrically connected to the predetermined terminal pin 14b of the connector 14, and connected to the external apparatus 50. Part of the ground layer 42 may be electrically connected to the ground line using an internal interconnect or the like of the first board 12.

The ground layer 42 and the ground line are electrically connected to the external apparatus 50 via the terminal pins 14b and grounded. It is noted that the first board 12 may be configured such that heat transferred (transported) to the ground layer 42 and the ground line is transferred (transported) to a casing of the external apparatus 50 via the terminal pins 14b to enable the heat generated in the semiconductor device 10 to be dissipated.

In general, vias that serve as connection regions electrically connecting lower layer interconnects to upper layer interconnects are formed as multilayer wirings. The vias are formed by etching an interlayer insulating film to form via holes and burying a metallic material into the via holes. A plurality of first vias 40 electrically (and thermally) connecting the first surface 12a to the ground layer 42 formed on the second layer 12h are formed in the first layer 12g of the first board 12. Although not shown in FIG. 3, vias for electrical connection to the signal layer and the power supply layer are also formed and electrically connected to the external apparatus 50 via the terminal pins 14b of the connector 14.

The first surface 12a of the first board 12 is provided with a semiconductor package 16. As shown in FIGS. 2B and 4A, the semiconductor package 16 has a second board 18 (a package board, a mounting board, a BGA board), a semiconductor chip 20 (a first electronic component, a Si chip, a die, the controller), and an insulating layer 22 (an insulator, an insulating sheet, a coating).

The second board 18 is connected to the first surface 12a via solder balls 16a. The second board 18 has a second surface 18a facing the first surface 12a, and a third surface 18b on the other side thereof, and is also provided with second vias 38 passing therethrough and through the second surface 18a and the third surface 18b. FIG. 4B is a plan view of the second surface 18a of the second board 18 and FIG. 4C is a plan view of the third surface 18b of the second board 18.

While FIG. 3 shows that the second vias 38 and the first vias 40 are formed at aligned positions, a positional relationship between the second vias 38 and the first vias 40 is not limited to this aligned relationship. As described above, a part of the second vias 38 formed in the second board 18 of the semiconductor package 16 is used to electrically connect the second surface 18a to the third surface 18b of the second board 18, while the other part of the second vias 38 is used for heat conduction of the heat, generated at a time of driving the semiconductor package 20, toward the first board 12.

Although not shown, the second board 18 has a multilayer structure formed by superimposing synthetic resins similarly to the first board 12. Wiring patterns of various shapes are formed on front surfaces of layers of the second board 18. For example, a signal layer for transmission and reception of signals, a ground layer, and a power supply layer are formed.

The semiconductor chip 20, which is, for example, a flip-chip mounting semiconductor, has a fourth surface 20a that is disposed on the third surface 18b of the second board 18 and faces the third surface 18b, and a fifth surface 20b on the other side of this fourth surface 20a. Very small metal protrusion (solder or the like) terminals (referred to as "bumps") 21 are formed on the fourth surface 20a of the semiconductor chip 20. The semiconductor chip 20 is bonded to the second board 28 by placing the semiconductor chip 20 on the second board 18 so that the bumps 21 come in contact with the third surface 18b and temporarily melting the bumps 21. The semiconductor chip 20 controls the other electronic components, for example, the memory chips 32 (also referred to as "second electronic components" or "NAND type flash memory chips") and the DRAM chip 54 mounted, together with the semiconductor package 16, on the first surface 12a of the first board 12. Normally, a plurality of memory chips 32 are provided, and FIG. 2A shows a case, for example, in which the two memory chips 32-1 and 32-2 are mounted. The power supply circuit module 58 is also mounted on the first surface 12a of the first board 12.

The semiconductor chip 20 writes and reads data to and from the memory chips 32 and transmits and receives data to and from the external apparatus 50 (personal computer, CPU core, or the like).

Although not shown, the semiconductor chip 20 may be formed from multiple layers of semiconductor chips and wire bonding may be used for interlayer connection. The semiconductor chip on the lowermost layer is bonded to the third surface 18b of the second board 18 by flip-chip mounting.

The insulating layer 22 is provided in such a manner as to cover (abut on) a front surface (with some exceptions) of the third surface 18b of the second board 18b and the fifth surface 20b of the semiconductor chip 20. Therefore, the semiconductor chip 20 turns into a state of being isolated from its surroundings on the second board 18. A sheet-like insulating layer may be used as the insulating layer 20 or the insulating layer 20 may be formed by applying an insulating resin as a coating or the like.

Although not shown in FIG. 3, clearances between the third surface 18b of the second board 18 and the fourth surface 20a of the semiconductor chip 20 generated by presence of the bumps 21 may be filled with an underfill agent. The underfill agent is, for example, a thermosetting resin. The underfill agent is made to penetrate through the clearances between the third surface 18b and the fourth surface 20a by capillary action, thereby serving as a buffer against an external stress such as a shock or bending and contributing to improved connection reliability of the bumps 21.

The exterior connection on the semiconductor package 16 is a BGA (Ball Grid Array) in which the solder balls 16a are arranged in a grid pattern on the second surface 18a of the second board 18. The semiconductor package 16 is electrically connected to pads (electrodes, not shown) formed on the first surface 12a of the first board 12 by temporarily melting the solder balls 16. The solder balls 16 are not necessarily disposed on the entire second surface 18a of the second board 18 but may be disposed on only a part of the second surface 18a.

Although not shown in FIG. 3, clearances between the first surface 12a of the first board 12 and the second surface 18a of the second board 18 generated by presence of the solder balls 16 may be filled with an underfill agent. The underfill agent is, for example, a thermosetting resin. The underfill agent is made to penetrate through the clearances between the first surface 12a and the second surface 18a by capillary action, thereby serving as a buffer against an external stress such as a shock or bending and contributing to improved connection reliability of the solder balls 16a.

As shown in FIGS. 2B and 4A, the semiconductor chip 20 that is of a generally square planar shape is placed on the upper surface (third surface 18b, FIG. 3) of the second board 18 that is similarly of a generally square planar shape. FIGS. 2B and 4B do not show the insulating layer 22. Many solder balls 16a are arranged on the lower surface (second surface 18a) of the second board 18. The solder balls 16a are electrically connected to the upper surface (third surface 18b) of the second board 18 via the second vias 38, and connected to internal circuits of the semiconductor chip 20 via interconnects (not shown) on the upper surface (third surface 18b) of the second board 18 connected to the solder balls 21.

It is generally known in a semiconductor package that one or a plurality of pins (the vias 38 in this embodiment) present in corner portions of a board (the second board 18 in this embodiment) are slightly higher than pins present in a central portion of the board in a probability of occurrence of solder cracks due to an influence of a difference in warpage between the board and a die (the semiconductor chip 20 in this embodiment) in a temperature cycle test of high temperature-low temperature. Owing to this, second vias 38a, 38b, 38c, and 38d, for example, present in the four corner portions of the second board 18 are not electrically connected to the semiconductor chip 20 but are connected to the ground layer 42 of the first board 12 via the solder balls 16a. Such pins are known as NC (non-connection) pins or NU (not usage) pins. The insulating layer 22 is not formed on portions of the third surface 18b of the second board 18 that correspond to the second vias 38a, 38b, 38c, and 38d. After forming the insulating layer 22, openings are formed therein by etching therethrough over the portions of the third surface 18b of the second board 18 that correspond to the second vias 38a, 38b, 38c, and 38d. By forming conductors in the openings, conductive exposed portions 39a, 39b, 39c, and 39d (often collectively denoted by "39") are provided in the third surface 18b of the second board 18 that correspond to the second vias 38a, 38b, 38c, and 38d. The exposed portions 39a, 39b, 39c, and 39d are electrically connected to the second vias 38a, 38b, 38c, and 38d. The insulating layer 22 that covers the front surface of the third surface 18b of the second board 18 and the fifth surface 20b of the semiconductor chip 20 covers the upper ends of the second vias 38 present in portions of the second board 18 other than the corner portions but does not cover the exposed portions 39a, 39b, 39c, and 39d connected to the second vias 38a, 38b, 38c, and 38d present in the corner portions. The second vias 38a, 38b, 38c, and 38d connected to the ground layer 42 of the first board 12 are thereby exposed to a front surface of the semiconductor package 16. A shape of the exposed portions 39 is not limited to a circular shape but may be a rectangular shape larger than the second vias 38a, 38b, 38c, and 38d. When the exposed portions 39 are of a circular shape, the exposed portions 39 may be equal in diameter to the second vias 38a, 38b, 38c, and 38d or larger in diameter than the second vias 38a, 38b, 38c, and 38d. While upper surfaces of the exposed portions 39 are equal in height to an upper surface of the insulating layer 22 in FIG. 3, the height of the exposed portions 39 may be, for example, higher and may be different from that of the insulating layer 22.

On the third surface 18b of the second board 18 shown in FIG. 4C, open circles indicate the second vias 38 connected to the internal circuits of the semiconductor chip 20 via the interconnects on the third surface 18b, and blackened circles indicate the second vias 38a, 38b, 38c, and 38d connected not to the semiconductor chip 20 but to the ground layer 42. It is assumed herein that three vias 38 in each of the corner portions are connected to the ground layer 42. The vias 38 connected to the ground layer 42 may be all exposed to the front surface of the semiconductor package 16 or only some of the vias 38 may be exposed thereto. In either case, the exposed portions 39 may be provided per via 38 or one exposed portion 39 may be provided per corner portion.

As shown in FIG. 2A, when static electricity is generated in the external apparatus 50 in a state in which the SSD 10 in which the semiconductor package 16 is mounted on the first board 12 is connected to the external apparatus 50, the static electricity is applied to the semiconductor package 16 from the upper surface (surface on which the insulating layer 22 is formed) of the semiconductor package 16. Electric charges generated by this static electricity are possibly carried to the insulating layer 22. However, the electric charges carried to the insulating layer 22 are carried to the ground layer 42 of the SSD 10 via the second vias 38*a*, 38*b*, 38*c*, and 38*d* from the conductive exposed portions 39 exposed to the front surface of the insulating layer 22. Supposing that the second vias 38*a*, 38*b*, 38*c*, and 38*d* exposed to the front surface of the semiconductor package 16 are not present, the electric charges generated by the static electricity applied to the semiconductor package 16 and carried to the insulating layer 22 are possibly carried to the internal circuits of the semiconductor chip 20 via the interconnects on the third surface 18*b* of the second board 18 to cause breakdown (ESD breakdown) of the internal circuits.

[ESD]

ESD (Electro-Static Discharge) occurs due to a discharge current carried in a semiconductor device. The semiconductor device is often broken down by the ESD that can occur following localized heat generation or localized electric field concentrations. There are several occurrence factors of the ESD. Test models for these occurrence factors of the ESD are known. Test methods currently applied are roughly divided into three types of model, that is, a human body model (HBM), a machine model (MM), and a charged device model (CDM).

Automation of assembly processes increases chances that the semiconductor device comes in contact with metals due to friction or electrostatic induction during automatic assembly. Owing to this, the CDM-caused ESD that occurs by contact of the charged device with the metals tends to increase as a result of process automation.

Demand for increased SSD performance is occurring and measures are taken for a speedup of the operations of the controller 20 to meet this demand. For high speed processing, the capacitance of a capacitor of the controller 20 is reduced as much as possible. An impedance of the controller 20 thereby becomes low and a high-speed operation of the controller 20 is realized. The flash memories 32 can achieve increases in processing speed by reducing capacitance of the capacitors thereof. However, there is a risk that information of the capacitors cannot be accurately read. Owing to this, the controller 20 has smaller capacitor capacitance than that of the flash memories 32. That is, since the controller 20 is smaller in capacitor capacitance than the flash memories 32, the controller 20 has a structure in which it is difficult to eliminate high frequency components of a current carried together with a high voltage pulse, and the resulting ESD resistance is low. For these reasons, a high ESD resistance is desired for the controller 20, compared with that of the flash memories 32.

The controller 20 is covered with the insulating layer 22. The insulator tends accumulate an electrostatically induced from an electrostatically charged object and to thereby become charged.

As described in the embodiment, connecting the controller 20 to the ground layer 42 of the SSD 10 via the conductive exposed portions 39*a*, 39*b*, 39*c*, and 39*d* exposed to the front surface of the insulating layer 22 and the second vias 38*a*, 38*b*, 38*c*, and 38*d* facilitates self discharge of the electric charges into the surrounding ambient (CDM resistance). Furthermore, it is possible to prevent electric charges due to ESG surge resulting from contact from outside (or from within the surrounding ambient) from being carried to the internal circuits of the controller 20 (HBM resistance, MM resistance).

In many cases, semiconductor chips, such as the flash memories 32 and the DRAM 54 that are mounted components other than the controller 20, are mounted on the package board by wire bonding. Alternatively, these semiconductor chips may be mounted using the flip-chip technology of the first embodiment similarly to the controller 20.

Summary of First Embodiment

In this way, according to the first embodiment, the electric charges carried to the insulating layer 22 are carried to the ground layer 42 of the SSD 10 via the exposed portions 39*a*, 39*b*, 39*c*, and 39*d* and the second vias 38*a*, 38*b*, 38*c*, and 38*d* and not carried to the internal circuits of the semiconductor chip 20. It is, therefore, possible to prevent an ESD breakdown. Conventionally, the encapsulation portion (also referred to as "overmold") formed from a resin material is further formed on the insulating layer 22 to improve insulation properties of the semiconductor chip 20 and to protect the semiconductor chip 20 from ESD breakdown. According to the embodiment, by contrast, even when an insulating resistance of the insulating layer 22 is low and the electric charges generated by the static electricity are carried to the insulating layer 22, the electric charges are carried to the ground layer 42 of the SSD 10 via the exposed portions 39*a*, 39*b*, 39*c*, and 39*d* and the second vias 38*a*, 38*b*, 38*c*, and 38*d*. The encapsulation portion may be, therefore, omitted. Omitting the encapsulation portion contributes to cost reduction of the SSD 10.

Second Embodiment

Figure 5:
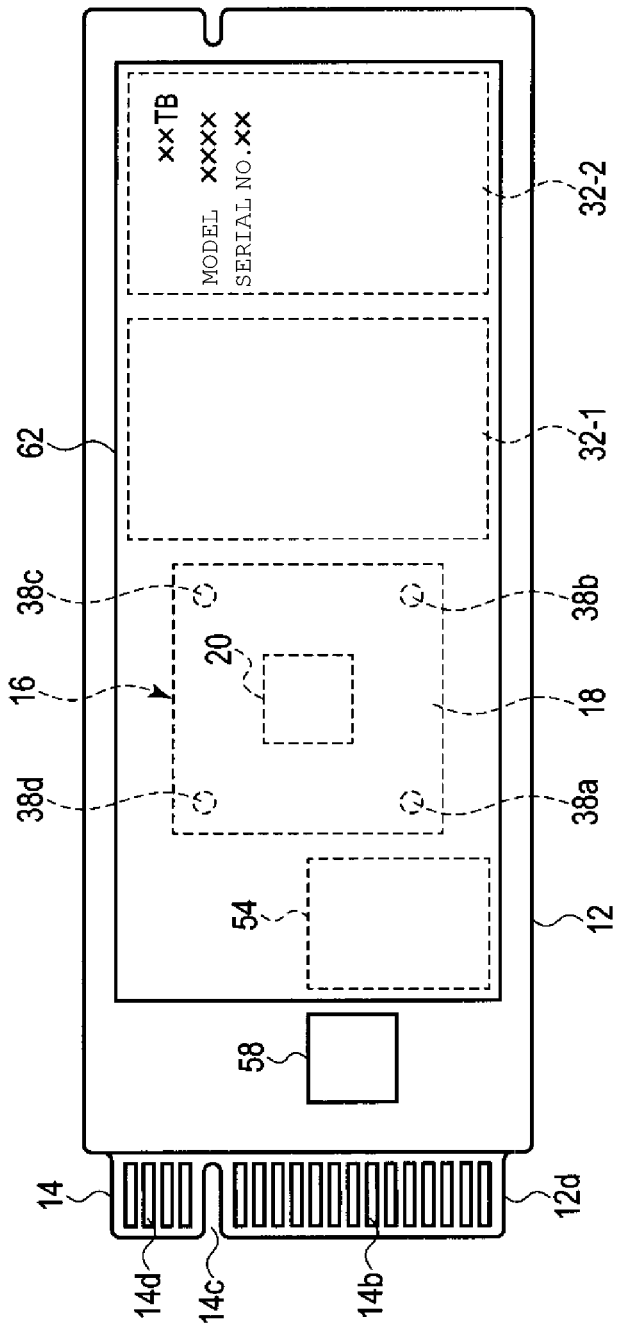
FIG. 5 is a plan view showing an example of an appearance of an SSD according to a second embodiment.
Figure 6:
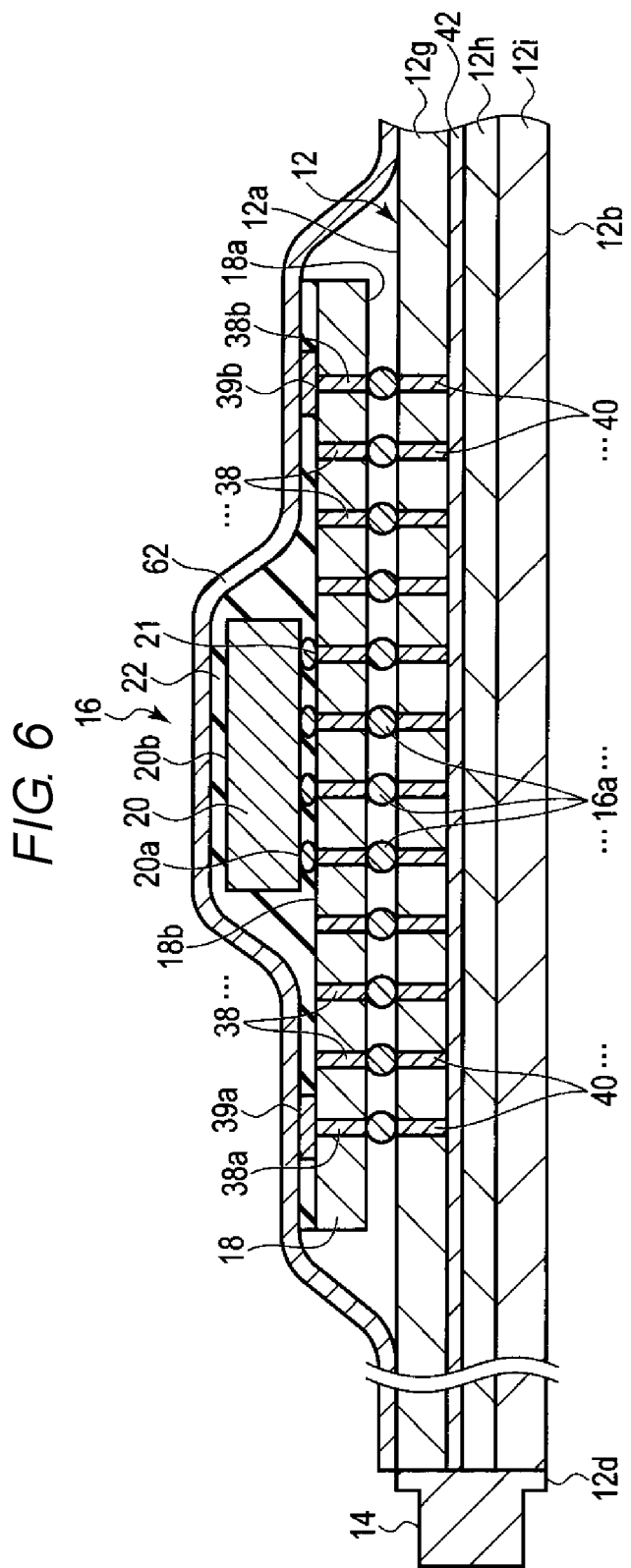
FIG. 6 shows an example of a cross-sectional structure near the controller.

FIG. 5 is a plan view showing an example of an appearance of an SSD 10A according to a second embodiment, and FIG. 6 is a cross-sectional view showing an example of the cross-sectional structure of the SSD 10A near the controller according to the second embodiment.

The SSD 10A according to the second embodiment differs from the SSD 10 according to the first embodiment only in that a name plate label 62 is affixed to the SSD 10A. Normally, a name plate label on which a model name and a serial number are written is affixed to an SSD. In the second embodiment, this name plate label 62 is configured with a conductive material, and affixed to the SSD 10A in such a manner, for example, as to cover the DRAM chip 54, the semiconductor package 16, and the memory chips 32-1 and 32-2 as shown in FIG. 5. Owing to this, as shown in FIG. 6, the name plate label 62 covers the insulating layer 22 of the semiconductor package 16 configuring the controller 20 and covers the exposed portions 39 exposed from the insulating layer 22. Owing to this, the name plate label 62 is electrically connected to the exposed portions 39.

The second embodiment exhibits the same advantages as those of the first embodiment and also exhibits the following advantages. Since the name plate label 62 is conductive, electric charges generated by static electricity are carried to the name plate label 62 when the static electricity is applied to the semiconductor package 16 and more easily carried to the ground layer 42 of the SSD 10A via the exposed portions 39*a*, 39*b*, 39*c*, and 39*d* and the second vias 38*a*, 38*b*, 38*c*, and 38*d*. For this reason, it is more difficult to carry the electric charges generated by the static electricity applied to the semiconductor package 16 to the internal circuits of the semiconductor chip 20 and it is, therefore, possible to further prevent ESD breakdown. As the name plate label 62 is larger in size, an amount of the electric charges carried to the ground layer 42 of the SSD 10A via the exposed portions 39a, 39b, 39c, and 39d and the second vias 38a, 38b, 38c, and 38d becomes larger. It is, therefore, possible to further prevent ESD breakdown.

While it is described that the name plate label normally used in the SSD is the conductive name plate label 62, a conductive sheet that simply covers the DRAM chip 54, the semiconductor package 16, the memory chips 32-1 and 32-2, and the like may be affixed to the SSD 10A in a situation in which the name plate label is not used.

Third Embodiment

Figure 7:
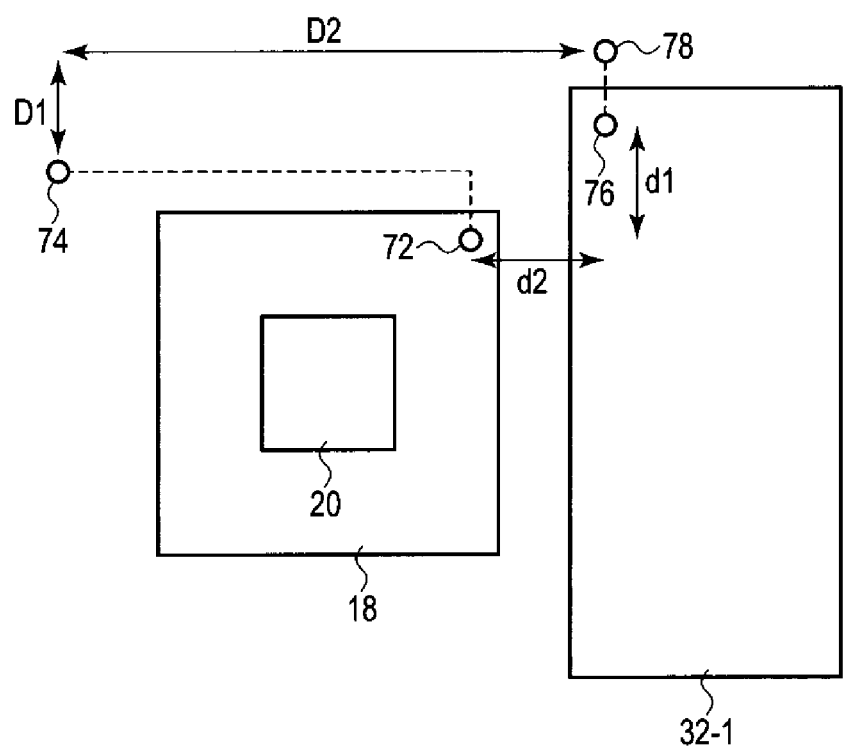
FIG. 7 shows an example of ground connection of an SSD according to a third embodiment.

FIG. 7 shows an example of ground connection of an SSD according to a third embodiment. According to the first and second embodiments, the electric charges carried to the insulating layer 22 are carried to the ground layer 42 of the SSD 10 or 10A via the exposed portions 39a, 39b, 39c, and 39d and the second vias 38a, 38b, 38c, and 38d. Ground terminals of the mounted chips other than the controller 20 are also connected to the ground layer 42 of the SSD 10 or 10A. For this reason, when the electric charges generated in the controller 20 by the static electricity are carried to the ground layer 42, grounds of the other mounted chips connected to the ground layer 42 also become high in potential instantaneously, which possibly causes breakdown of the other mounted chips. Likewise, potential fluctuations of the other mounted chips cause the ground layer 42 to become high in potential instantaneously and the second vias 38a, 38b, 38c, and 38d of the controller 20 to become high in potential, which possibly causes ESD breakdown of the controller 20. This possibility depends on an interconnect distance between a ground contact of the controller 20 on the ground layer 42 and a ground contact of any of the other mounted chips on the ground layer 42. The possibility becomes higher as the interconnect distance is shorter. The interconnect distance means not a distance between the two contacts.

In the third embodiment, connection of a ground terminal 72 of the controller 20 and a ground terminal 76 of the other chip, for example, the flash memory 32-1 to the ground layer 42 will be described. As shown in FIG. 7, when the ground terminal 72 of the controller 20 and the ground terminal 76 of the flash memory 32-1 are both connected to the ground layer 42 as they are via the second vias 38 and the first vias 40, an interconnect distance between a ground contact of the controller 20 (just below the terminal 72) on the ground layer 42 and a ground contact of the flash memory 32-1 (just below the terminal 76) on the ground layer 42 is equal to or longer than d1+d2. The interconnect distance d1+d2 is a shortest distance in a case in which interconnects can be formed into a grid pattern, and the distance becomes longer if the interconnect paths are detoured between these locations 72, 76. On the other hand, when the terminals 72 and 76 are connected to the ground layer 42 via interconnects on the layer other than the ground layer 42, it is possible to extend the interconnect distance between the ground contact of the controller 20 and the ground contact of the flash memory 32-1 in the ground layer 42. For example, the interconnect is extended on a layer other than the ground layer 42 so that the ground terminal 72 of the controller 20 is farther from the ground terminal 76 of the flash memory 32-1, and the ground terminal 72 is connected to the ground layer 42 at a contact 74. In addition, the interconnect is extended on a layer other than the ground layer 42 so that the ground terminal 76 of the flash memory 32-1 is farther from the ground terminal 72 of the controller 20, and the ground terminal 76 is connected to the ground layer 42 at a contact 78. In this case, the interconnect distance between the contacts 74 and 78 along the ground is equal to or longer than D1+D2.

In this way, when the distance between the ground terminals of the two chips is short, the interconnect distance between the ground contacts of the two ground terminals is increased by extending the interconnects using the interconnects on the layer other than the ground layer so that the distance between the contacts on the ground layer becomes longer than the distance between the terminals. It is thereby possible to prevent a high potential generated in one of the chips from being propagated to the other chip and prevent breakdown of the other chip.

While an example of applying the present disclosure to the controller 20 of a SSD 10 or a SSD 10A has been described the present disclosure is not limited to these particular examples and the present disclosure is also generally applicable to an arbitrary semiconductor device using a flip-chip mounting.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
a first board including a plurality of vias;
a semiconductor chip flip-chip mounted to the first board;
an insulating layer covering the first board and the semiconductor chip; and
a second board electrically connected to the first board and including a ground terminal thereon, wherein
the plurality of vias include a first via electrically connected to the semiconductor chip; and a second via that is not electrically connected to the semiconductor chip,
the insulating layer includes an opening at a position above the second via, the second via is not covered by the insulating layer, and a conductive portion is disposed in the opening of the insulating layer,
an upper surface of the conductive portion is flush with an upper surface of the insulating layer, and
the conductive portion has a thickness less than a thickness of the semiconductor chip above the first board and is electrically connected to the ground terminal of the second board through the second via.

2. The semiconductor device according to claim 1, wherein the first board is rectangular, and
the second via is located adjacent to a corner of the first board.

3. The semiconductor device according to claim 1, further comprising:
a conductive sheet disposed over the insulating layer.

4. The semiconductor device according to claim 3, wherein the conductive sheet includes a label including information concerning the semiconductor device.

5. The semiconductor device according to claim 1, wherein the plurality of vias include a plurality of second vias that are not electrically connected to the semiconductor chip, the plurality of second vias including the second via, and the conductive portion in the opening of the insulating layer is electrically connected to the ground terminal of the second board through the plurality of second vias.

6. The semiconductor device according to claim 1, wherein the second via is one of the plurality of vias that is provided at an outermost position in a direction along a surface of the first board.

7. A semiconductor device, comprising:
a first board including a ground terminal; and
a first semiconductor component mounted on the first board, wherein
the first semiconductor component comprises:
  a second board having a plurality of vias;
  a semiconductor chip flip-chip mounted to the second board; and
  an insulating layer covering the second board and the semiconductor chip, wherein
the plurality of vias of the second board include:
  a first via electrically connected to the semiconductor chip; and
  a second via that is not electrically connected to the semiconductor chip,
the insulating layer includes an opening at a position above the second via, the second via is not covered with the insulating layer, and a conductive portion is disposed in the opening of the insulating layer,
an upper surface of the conductive portion is flush with an upper surface of the insulating layer, and
the conductive portion has a thickness less than a thickness of the semiconductor chip above the second board and is electrically connected to the ground terminal of the first board through the second via.

8. The semiconductor device according to claim 7, wherein
the second board has a rectangular shape having corners, and
the second via is located adjacent to one of the corners of the second board.

9. The semiconductor device according to claim 7, wherein:
the first board comprises a ground layer, and a plurality of third vias connected to the ground layer; and
the second via is electrically connected to the ground layer through one of the third vias of the first board.

10. The semiconductor device according to claim 9, further comprising:
a second semiconductor component mounted on the first board; and
a conductive layer covering the first semiconductor component and the second semiconductor component.

11. The semiconductor device according to claim 10, wherein the conductive layer comprises a label on which information concerning the semiconductor device is provided.

12. The semiconductor device according to claim 11, wherein:
a ground terminal of the first semiconductor component is connected to the ground layer at a first point through an interconnect on the first board;
a ground terminal of the second semiconductor component is connected to the ground layer at a second point through an interconnect on the first board; and a distance between the first point and the second point is greater than a distance between a third point just below the ground terminal of the first semiconductor component on the ground layer and a fourth point just below the ground terminal of the second semiconductor component on the ground layer.

13. The semiconductor device according to claim 7, wherein
the plurality of vias include a plurality of second vias that are not electrically connected to the semiconductor chip, the plurality of second vias including the second via, and
the conductive portion in the opening of the insulating layer is electrically connected to the ground terminal of the first board through the plurality of second vias.

14. The semiconductor device according to claim 7, wherein the second via is one of the plurality of vias that is provided at an outermost position in a direction along a surface of the second board.

15. A semiconductor device, comprising:
a first board comprising a first surface, a second surface, and a body extending therebetween bounded by a perimeter, a first conductive path extending therethrough in a first region of the board and a second conductive path extending therethrough in a second region of the board;
a semiconductor chip flip-chip mounted over the first region of the first surface of the first board, wherein the semiconductor chip is electrically connected to the first conductive path;
a coating covering the semiconductor chip and the first surface of the first board in a region where the semiconductor chip is not mounted thereover; and
a first conductor extending through the coating and in electric contact with the second conductive path in the second region, wherein a surface of the first conductor spaced from the first surface of the first board is exposed at and flush with a surface of the coating spaced from the first surface of the first board, the first conductor has a thickness less than a thickness of the semiconductor chip, and the first conductor is electrically connected to ground through the second conductive path.

16. The semiconductor device according to claim 15, wherein the first conductor is disposed over the second region of the first board.

17. The semiconductor device according to claim 16, wherein the surface of the first conductor spaced from the first surface of the first board is coplanar with, or extends outwardly from, the surface of the coating spaced from the first surface of the first board.

18. The semiconductor device according to claim 17, further comprising a conductive layer overlying the surface of the coating spaced from the first surface of the first board and contacting the surface of the first conductor spaced from the first surface of the first board.

19. The semiconductor device according to claim 15, wherein
a plurality of second conductive paths, including the second conductive path, extend through the body of the first board in the second region, and
the first conductor is electrically connected to ground through the plurality of second conductive paths.

* * * * *